(12) United States Patent
Moliere

(10) Patent No.: US 6,895,227 B1
(45) Date of Patent: May 17, 2005

(54) TRANSMISSION OUTPUT STAGE FOR A MOBILE TELEPHONE

(75) Inventor: Thomas Moliere, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/806,974

(22) PCT Filed: Jan. 12, 1999

(86) PCT No.: PCT/DE99/00037
§ 371 (c)(1),
(2), (4) Date: Jul. 18, 2001

(87) PCT Pub. No.: WO00/21202
PCT Pub. Date: Apr. 13, 2000

(30) Foreign Application Priority Data

Oct. 6, 1998 (DE) .......................................... 198 46 069

(51) Int. Cl.$^7$ ................................................. H04B 1/04

(52) U.S. Cl. ........................ 455/115; 330/51; 330/301; 330/286

(58) Field of Search .......................... 330/51, 301, 286; 455/332

(56) References Cited

U.S. PATENT DOCUMENTS

| | | | |
|---|---|---|---|
| 4,422,047 A | 12/1983 | Wright | 330/51 |
| 5,652,546 A | 7/1997 | Dent | 330/276 |
| 5,774,017 A | 6/1998 | Adar | 330/51 |
| 5,821,815 A | * 10/1998 | Mohwinkel | 330/286 |
| 6,029,054 A | * 2/2000 | Lemley | 455/257 |

* cited by examiner

Primary Examiner—Ahmad F. Matar
Assistant Examiner—Marie C. Ubiles
(74) Attorney, Agent, or Firm—Bell Boyd & Lloyd LLC

(57) ABSTRACT

In a transmission output stage for a multifrequency mobile telephone, the transmit signal of operation at the low frequency is generated by a push-pull output stage which is operated in single-ended mode for generating the transmit signal at the higher frequency.

13 Claims, 2 Drawing Sheets

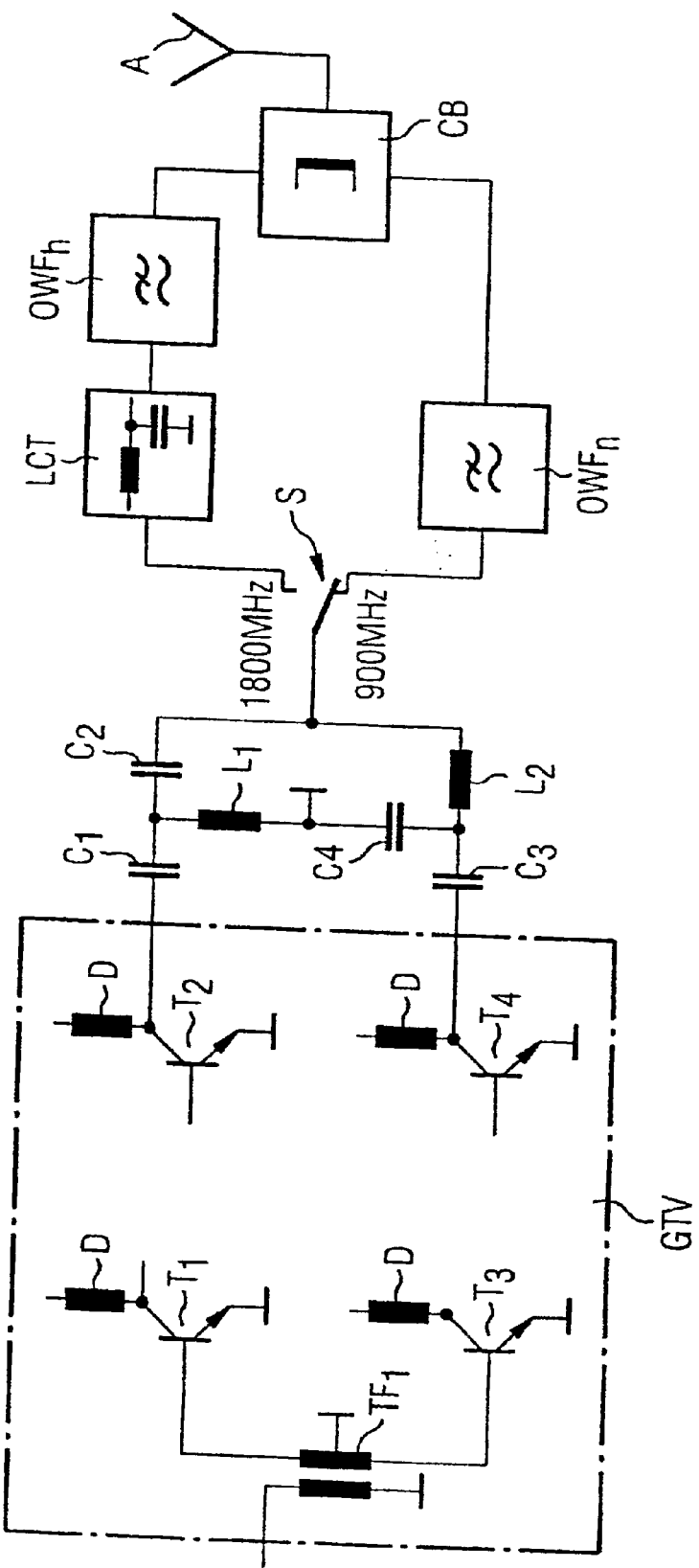

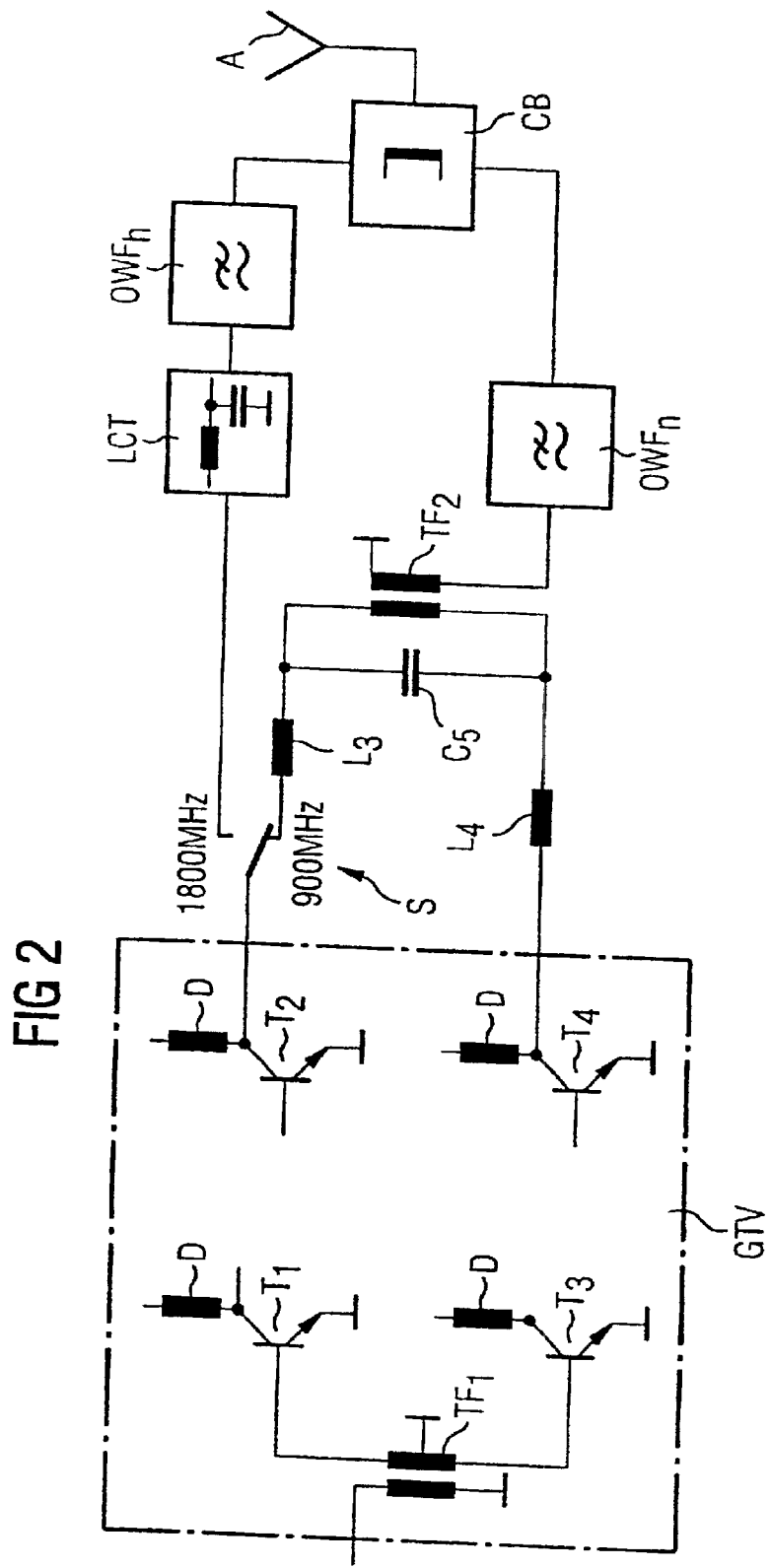

TRANSMISSION OUTPUT STAGE FOR A MOBILE TELEPHONE

BACKGROUND OF THE INVENTION

1. Field of the Invention

The present invention relates to a transmission output stage for a mobile telephone and, in particular, to a transmission stage for such a mobile telephone which is designed for two frequency bands.

2. Description of the Prior Art

At present, multiband mobile telephones are being developed and the first types are on the market which can operate at two operating frequencies, that is to say at 900 MHz and 1800 MHz in Europe in accordance with the relevant system definitions, and at 900 MHz and 1900 MHz frequencies in the USA.

First developments operate with narrow-band parallel amplifier chains in the transmit and receive section. Such dual-band output stages thus have, for each frequency band, an amplifier optimized for this band which is associated with a considerable expenditure on components and, therefore, with costs and space requirements. A dual-band output stage of this type having separate amplifier branches for each band is, for example, the TST0911 chip by the manufacturer TEMIC. When the chip is used in a mobile telephone, the two outputs of the chip are conducted to an antenna via a diplexer. Here, too, the disadvantages are the costs and the circuit board area needed and the necessary expenditure for filtering the harmonics.

To lower costs, the aim is to be able to process the two frequency bands with one amplifier chain. Thus, in the article by V. Güngerich, M. Pöbl: "Bessere Handys durch Gallium-Arsenid MMICs" [Better mobile telephones by using Gallium-Arsenid MMICs], Elektronik August 1998, p. 90–96, the structure of a CGY0819 amplifier chip by Siemens for multifrequency mobile telephones is described which exhibits separate RF inputs, the signals being conducted via a narrow-band amplifier in the respective band and the necessary output power being generated in a common output stage. In this arrangement, the preliminary stages can be switched on and off separately from one another depending on the operating state.

Since, therefore, the common output amplifier operates both for 900 MHz and for 1800 MHz, it is mandatorily of wide-band design. In 900 MHz operation, a strong first harmonic is, therefore, mandatorily produced at 1800 MHz. This harmonic can only be suppressed with additional filters which result in considerable insertion loss of the useful signal at the fundamental frequency and need which additional components. Furthermore, the matching elements must be elaborately switched with the aid of switches; for example, PIN diode switches or diplex filters at the output of the transmit transistor.

The present invention is, therefore, directed to a transmission output stage for a multifrequency mobile radio device which simplifies the critical switching of the output match of a dual-band transmission output stage for both frequency bands with simultaneous good suppression of the first harmonic of the lower-frequency signal.

SUMMARY OF THE INVENTION

Accordingly, in a transmission output stage according to the present invention for a multifrequency mobile telephone, the transmit signal is generated by a push-pull output stage during operation at the low frequency whereas the transmit signal is generated in single-ended operation of the push-pull output stage during operation at the higher frequency.

The single-ended operation can be generated by coupling the signal out of only one output transistor whereas the other output transistor is cut off. Furthermore, the single-ended operation can be achieved by switching off the supply voltage or cutting off the transistors for one branch of the push-pull output stage. It is also possible to arrange in one branch of the push-pull amplifier a switch which causes this branch to be short-circuited when the transmission output stage is operated in single-ended mode. For this purpose, a PIN diode switch or an FET switch is preferably used.

The transmission output stage preferably exhibits an output matching circuit. The transmission output stage can also exhibit a harmonic filter for the low frequency and a harmonic filter for the high frequency, the transmission output stage also exhibiting a switch which conducts the signal to the appropriate harmonic filter in accordance with the frequency band currently used.

Furthermore, an LC transformer which is used for matching the load impedance of the high-frequency branch to the antenna impedance is arranged in the output branch of the high frequency.

The output to the antenna or to the antenna combiner for the high-frequency band is preferably blocked during operation in the low-frequency band in the transmission output stage. A switch which is implemented by a PIN diode switch or an FET switch can be used for blocking the output to the antenna or to the antenna combiner.

Either 900 MHz and 1800 MHz or 900 MHz and 1900 MHz are preferably used as frequencies. In this case, the first set of frequencies, namely 900 MHz and 1800 MHz, is used in Europe whereas a device is ready to operate in Europe and the USA with the second set of frequencies; i.e., 900 MHz and 1900 MHz.

The present invention has the following advantages. Due to the push-pull operation for generating the output power at the lower frequency via a push-pull output stage, the first harmonic is already additionally suppressed by 20 . . . 30 dB which considerably lowers the expenditure for suppressing harmonics. Since the power is distributed to two transistors or branches of the push-pull output stage, the same amount of semiconductor material is required as in the single-ended operation with one transistor previously used. During operation at the higher frequency, single-ended operation is carried out as explained above. Since, in the case of GSM, the doubled frequency (1800 MHz) requires only half the power as the low frequency (900 MHz), the transistor (the transistors) is optimally driven in both bands. Furthermore, with the design of the matching circuit according to the present invention, the matching elements of the push-pull circuit can also be used for the single-ended coupling-out at the doubled frequency which further reduces the circuit expenditure.

Additional features and advantages of the present invention are described in, and will be apparent from, the following Detailed Description of the Preferred Embodiments and the Drawings.

DESCRIPTION OF THE DRAWINGS

FIG. 1 shows a circuit diagram of a first embodiment of the present invention, and FIG. 2 shows a circuit diagram of a second embodiment of the present invention.

DETAILED DESCRIPTION OF THE PREFERRED EMBODIMENTS

The preferred embodiment of FIG. 1 diagrammatically shows a push-pull amplifier GTV which exhibits an upper branch consisting of transistors $T_1$ and $T_2$ and a lower branch consisting of transistors $T_3$ and $T_4$ to which the input signal is applied via a transformer TF. For each transistor $T_1$, $T_2$, $T_3$ and $T_4$, a radio-frequency choke D is diagrammatically drawn in each case. The actual internal wiring or implementation of the push-pull amplifier is of no significance here and is not, therefore, shown. The only significant factor is that the push-pull amplifier GTV outputs two output voltages which are phase-shifted by 180°. These output signals are conducted, via an output matching circuit consisting of the capacitances $C_1$ and $C_2$ and an inductance L, in the upper branch and the capacitances $C_3$ and $C_4$ and the inductance $L_2$ in the lower branch, to a switch S for the case of operation at 900 MHz. The output matching circuit provides an impedance match and a resultant phase difference of 0° of the two signals due to the LC section $L_1$, $C_2$ of the upper branch and the LC section $C_4$,$L_2$ of the lower branch. The first harmonic which is at 1800 MHz with an operation at 900 MHz is already suppressed by 20 to 30 dB by using the push-pull amplifier. To completely meet the requirements of the GSM standard at 900 MHz operation, the signal is conducted via the switch S to a harmonic filter $OWF_n$, which performs the appropriate filtering. The transmit signal passes to an antenna A via a combiner CB.

When the transmission output switch is operated at 1800 MHz, the push-pull amplifier GTV is operated in single-ended mode by deactivating, for example, the lower branch. This can be done by cutting off the lower branch $T_3$ and $T_4$, for example by switching off the direct-voltage supply of the lower branch, or connecting (short-circuiting) the base, for example of the transistor $T_4$ (or $T_3$), to ground via a PIN diode switch. The signal of the push-pull amplifier GTV in single-ended mode is passed via the high-pass filter formed by the elements $C_1$, $C_2$ and $L_1$ through to the switch S which, in the 1800 MHz position, applies the signal to an LC transformer which produces the necessary impedance match to the antenna A. The signal is then filtered in a harmonic filter $OWF_n$ for the high frequency in order to filter the harmonics out of the signal in accordance with the GSM standard. The transmit signal passes through the antenna A via the combiner CB.

FIG. 2 shows a second embodiment of the transmit stage which differs from the embodiment of FIG. 1 in the output matching circuit. The output signals of the push-pull amplifier GTV here pass to an LC transformer consisting of the inductances $L_3$ and $L_4$ and the capacitance $C_5$, which is followed by a push-pull transformer $TF_2$, in the case of operation at the lower frequency, the switch S being set to the lower position for the 900 MHz operation. This output matching circuit provides for the necessary impedance match to the antenna and for a phase difference of 0° of the signals so that these are combined in the correct phase before the harmonic filter OWF for the low frequency.

In the case where the transmission output stage is operated at the high frequency, 1800 MHz in this case, the push-pull amplifier is operated in single-ended mode as in the first embodiment of FIG. 1 and the output signal passes via the switch, which is in the 1800 MHz position, directly to the upper branch consisting of an LC transformer LCT and the harmonic filter $OWF_b$ for the high frequency.

Although the present invention has been described with reference to specific embodiments, those of skill in the art will recognize that changes may be made thereto without departing from the spirit and scope of the invention as set forth in the hereafter appended claims.

I claim:

1. A transmission output stage for a multifrequency mobile telephone, comprising a push-pull amplifier having first and second outputs, wherein a transmit signal is generated by the push-pull amplifier via both the first and second outputs during operation at a lower frequency, and the transmit signal is generated in single-ended operation of the push-pull amplifier via only the first output during operation at a higher frequency.

2. A transmission output stage for a multifrequency mobile telephone as claimed in claim 1, wherein the push-pull amplifier further includes a first output transistor associated with the first output and a second output transistor associated with the second output, such that the single-ended operation is generated by coupling the signal out of only the first output transistor while the second output transistor is cut off.

3. A transmission output stage of a multifrequency mobile telephone as claimed in claim 2, wherein the push-pull amplifier further includes a first branch associated with both the first output transistor and the first output, and a second branch associated with both the second output transistor and the second output, such that the single-ended operation is achieved by switching off one of a supply voltage to the second branch and the second transistor.

4. A transmission output stage for a multifrequency mobile telephone as claimed in claim 2, wherein the push-pull amplifier further includes a first branch associated with both the first output transistor and the first output, a second branch associated with both the second output transistor and the second output, and a switch arranged in the second branch which causes the second branch to be short-circuited during single-ended operation.

5. A transmission output stage for a multifrequency mobile telephone as claimed in claim 4, wherein the switch is one of a PIN diode switch and an FET switch.

6. A transmission output stage for a multifrequency mobile telephone as claimed in claim 1, further comprising an output matching circuit connected to the first and second outputs of the push-pull amplifier.

7. A transmission output stage for a multifrequency mobile telephone as claimed in claim 6, further comprising a first harmonic filter for the lower frequency, a second harmonic filter for the higher frequency, and a further switch which conducts the transmit signal to the respective first and second harmonic filters depending upon the frequency used.

8. A transmission output stage for a multifrequency mobile telephone as claimed in claim 7, further comprising an LC transformer arranged in a branch of the first harmonic filter.

9. A transmission output stage for a multifrequency mobile telephone as claimed in claim 7, further comprising an LC transformer arranged in a branch of the second harmonic filter.

10. A transmission output stage for a multifrequency mobile telephone as claimed in claim 1, further comprising at least one of an antenna and an antenna combiner, wherein an output to the at least one of the antenna and the antenna combiner for the higher frequency is blocked during operation in the lower frequency.

11. A transmission output stage of a multifrequency mobile telephone as claimed in claim 9, wherein at least one of a PIN diode switch and an FET switch is used to block the output to the at least one of the antenna and the antenna combiner for the higher frequency.

12. A transmission output stage for a multifrequency mobile telephone as claimed in claim 1, wherein the lower frequency is approximately 900 MHz and the higher frequency is approximately 1800 MHz.

13. A transmission output stage for a multifrequency mobile telephone as claimed in claim 1, wherein the lower frequency is approximately 900 MHz and the higher frequency is approximately 1900 MHz.

* * * * *